(12) United States Patent
Foroudi (10) Patent No.: US 9,048,801 B2
(45) Date of Patent: Jun. 2, 2015

(54) APPARATUS AND METHODS FOR BUFFER LINEARIZATION

(71) Applicant: Analog Devices, Inc., Norwood, MA (US)

(72) Inventor: Omid Foroudi, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/337,944

(22) Filed: Jul. 22, 2014

(65) Prior Publication Data

US 2014/0333381 A1    Nov. 13, 2014

Related U.S. Application Data

(62) Division of application No. 13/784,400, filed on Mar. 4, 2013, now Pat. No. 8,791,758.

(51) Int. Cl.
*H03F 3/45*    (2006.01)
*H03G 3/30*    (2006.01)
*H03F 3/19*    (2006.01)

(52) U.S. Cl.
CPC ............... *H03G 3/3036* (2013.01); *H03F 3/45* (2013.01); *H03F 3/19* (2013.01); *H03F 2200/451* (2013.01)

(58) Field of Classification Search
CPC ........................................................ H03F 3/45
USPC ........................................ 330/253, 254, 261
See application file for complete search history.

(56) References Cited

U.S. PATENT DOCUMENTS

| 6,046,639 | A | 4/2000 | Kudo |
| 6,798,290 | B2 | 9/2004 | Groe et al. |
| 7,167,051 | B2 | 1/2007 | Botker |
| 8,063,702 | B2 * | 11/2011 | Lim ............................... 330/253 |
| 8,482,352 | B2 | 7/2013 | Doany et al. |
| 8,791,758 | B1 | 7/2014 | Foroudi et al. |

* cited by examiner

*Primary Examiner* — Henry Choe
(74) *Attorney, Agent, or Firm* — Knobbe Martens Olson & Bear LLP (57) ABSTRACT

Apparatus and methods for buffer linearization are provided. In certain implementations, an amplifier includes a buffer circuit and a gain circuit. The buffer circuit includes a buffer transistor pair used to buffer a differential input signal to generate a differential buffered signal. Additionally, the gain circuit includes a gain transistor pair configured to amplify the buffered differential signal to generate an amplified differential signal. The buffer circuit can include a linearization transistor pair configured to decrease the buffer circuit's output impedance and to provide feedback that reduces changes in the voltage of the differential buffered signal in response to displacement currents associated with the $C_{JC}$ or $C_{GD}$ capacitances of the gain transistor pair.

20 Claims, 6 Drawing Sheets

APPARATUS AND METHODS FOR BUFFER LINEARIZATION

CROSS-REFERENCE TO RELATED APPLICATIONS

This application is a divisional of U.S. application Ser. No. 13/784,400, filed Mar. 4, 2013, titled "APPARATUS AND METHODS FOR BUFFER LINEARIZATION", now U.S. Pat. No. 8,791,758, the entire disclosure of which is hereby incorporated herein by reference.

BACKGROUND

1. Field

Embodiments of the invention relate to electronic systems, and more particularly, to amplifiers.

2. Description of the Related Technology

Certain electronic systems, such as mixers, modulators and/or demodulators, can include an amplifier for amplifying a relatively weak signal. For example, a radio frequency (RF) system can include an amplifier for amplifying the output of a mixer to generate an amplified signal.

There is a need for improved amplifiers. Furthermore, there is a need for amplifiers having high linearity and/or wide bandwidth.

SUMMARY

In one embodiment, an apparatus includes a gain circuit and a buffer circuit. The gain circuit includes a first gain transistor and a second gain transistor. An emitter of the first gain transistor is electrically connected to an emitter of the second gain transistor, and the first and second gain transistors have a first type of device polarity. The buffer circuit includes a first buffer transistor, a second buffer transistor, a first linearization transistor, and a second linearization transistor. The first buffer transistor includes an emitter electrically connected to a base of the first gain transistor and a base configured to receive a first input signal. The second buffer transistor includes an emitter electrically connected to a base of the second gain transistor and a base configured to receive a second input signal. The first and second buffer transistors have a second type of device polarity opposite the first type of device polarity. The first linearization transistor includes a collector electrically connected to the base of the first gain transistor and a base electrically connected to a collector of the first buffer transistor. The second linearization transistor includes a collector electrically connected to the base of the second gain transistor and a base electrically connected to a collector of the second buffer transistor. The first and second linearization transistors have the first type of device polarity.

In another embodiment, an apparatus includes a gain circuit and a buffer circuit. The gain circuit includes a first gain transistor and a second gain transistor. A source of the first gain transistor is electrically connected to a source of the second gain transistor, and the first and second gain transistors have a first type of device polarity. The buffer circuit includes a first buffer transistor including a source electrically connected to a gate of the first gain transistor and a gate configured to receive a first input signal. The second buffer transistor includes a source electrically connected to a gate of the second gain transistor and a gate configured to receive a second input signal. The first and second buffer transistors have a second type of device polarity opposite the first type of device polarity. The first linearization transistor includes a drain electrically connected to the gate of the first gain transistor and a gate electrically connected to a drain of the first buffer transistor. The second linearization transistor includes a drain electrically connected to the gate of the second gain transistor and a gate electrically connected to a drain of the second buffer transistor. The first and second linearization transistors have the first type of device polarity.

In another embodiment, a method of electronic amplification is provided. The method includes buffering a differential input signal to generate a differential buffered signal using a buffer circuit, and amplifying the differential buffered signal to generate an amplified differential signal using a gain circuit. The buffer circuit includes a first buffer transistor, a second buffer transistor, a first linearization transistor, and a second linearization transistor. The differential input signal is received between a base of the first buffer transistor and a base of the second buffer transistor, and the differential buffered signal is generated between an emitter of the first buffer transistor and an emitter of the second buffer transistor. The emitter of the first buffer transistor is electrically connected to a collector of the first linearization transistor, and the emitter of the second buffer transistor is electrically connected to a collector of the second linearization transistor. The first and second linearization transistors have a first type of device polarity, and the first and second buffer transistors have a second type of device polarity opposite the first type of device polarity. The gain circuit includes a first gain transistor and a second gain transistor, and the differential buffered signal is received between a base of the first gain transistor and a base of the second gain transistor. The amplified differential signal is generated between a collector of the first gain transistor and a collector of the second gain transistor, and the first and second gain transistors have the first type of polarity.

In another embodiment, a method of electronic amplification is provided. The method includes buffering a differential input signal to generate a differential buffered signal using a buffer circuit, and amplifying the differential buffered signal to generate an amplified differential signal using a gain circuit. The buffer circuit includes a first buffer transistor, a second buffer transistor, a first linearization transistor, and a second linearization transistor. The differential input signal is received between a gate of the first buffer transistor and a gate of the second buffer transistor, and the differential buffered signal is generated between a source of the first buffer transistor and a source of the second buffer transistor. The source of the first buffer transistor is electrically connected to a drain of the first linearization transistor, and the source of the second buffer transistor is electrically connected to a drain of the second linearization transistor. The first and second linearization transistors have a first type of device polarity, and the first and second buffer transistors have a second type of device polarity opposite the first type of device polarity. The gain circuit includes a first gain transistor and a second gain transistor. The differential buffered signal is received between a gate of the first gain transistor and a gate of the second gain transistor, and the amplified differential signal is generated between a drain of the first gain transistor and a drain of the second gain transistor. The first and second gain transistors have the first type of polarity.

DETAILED DESCRIPTION OF CERTAIN EMBODIMENTS

The following detailed description of certain embodiments presents various descriptions of specific embodiments of the invention. However, the invention can be embodied in a multitude of different ways, for example, as defined and covered by the claims. In this description, reference is made to the drawings in which like reference numerals may indicate identical or functionally similar elements.

Differential amplifiers, such as those operating using relatively large currents, can use an input buffer to improve the amplifier's bandwidth. For example, the amplifier can include a buffer stage and a gain stage, and the buffer stage can buffer a differential input signal to generate a buffered signal for the gain stage.

The gain stage can include an input differential transistor pair, which can include parasitic capacitances that can generate displacement currents. For example, when the differential transistor pair of the gain stage is implemented using bipolar transistors, a base-to-collector or junction capacitance ($C_{JC}$) of the bipolar transistors can generate displacement currents or $C*dV/dt$ currents associated with changes in the transistors' base-to-collector voltages during amplification. Similarly, when the differential transistor pair of the gain stage is implemented using field-effect transistors (FETs), a gate-to-drain capacitance ($C_{GD}$) of the FETs can generate displacement currents associated with changes in the transistors' gate-to-drain voltages during amplification.

The $C_{JC}$ or $C_{GD}$ displacement currents can cause distortion or non-linearity in the buffer stage driving the gain stage's differential transistor pair. For example, the $C_{JC}$ or $C_{GD}$ displacement currents can operate to modulate the buffer stage. Additionally, the $C_{JC}$ or $C_{GD}$ displacement currents themselves can have a non-linear component that can generate a non-linear voltage at the buffer's outputs. The non-linear voltage can reach the inputs of the differential transistor pair, and can be amplified by the gain stage and contribute to output non-linearity.

To reduce non-linearity or distortion, the buffer stage's bias current can be increased to reduce the buffer stage's driving resistance. However, increasing the current of the buffer stage can also undesirably increase DC power consumption. Additionally, increasing the buffer stage's bias current also may not reduce output distortion associated with the flow of non-linear displacement current from the gain stage's output terminals through the $C_{JC}$ or $C_{GD}$ capacitors of the differential transistor pair.

Apparatus and methods for buffer linearization are provided herein. In certain implementations, an amplifier includes a buffer circuit and a gain circuit. The buffer circuit includes a buffer transistor pair used to buffer a differential input signal to generate a differential buffered signal. Additionally, the gain circuit includes a gain transistor pair configured to amplify the buffered differential signal to generate an amplified differential signal. The buffer circuit can include a linearization transistor pair configured to decrease the buffer circuit's output impedance and to reduce changes in the voltage of the differential buffered signal in response to displacement currents associated with the $C_{JC}$ or $C_{GD}$ capacitances of the gain transistor pair. Furthermore, in certain implementations, a current circulation transistor pair is cross-coupled with the gain transistor pair and is used to circulate the $C_{JC}$ or $C_{GD}$ displacement currents back to the outputs of the gain circuit to reduce output distortion.

The amplifiers described here can have enhanced linearity, such as improved intermodulation distortion (IMD) and/or third-order intercept point (IP3). Furthermore, the amplifiers described herein can have wide bandwidth and/or a relatively low DC power consumption.

Overview of One Example of an Electronic System including an Amplifier

Figure 1:
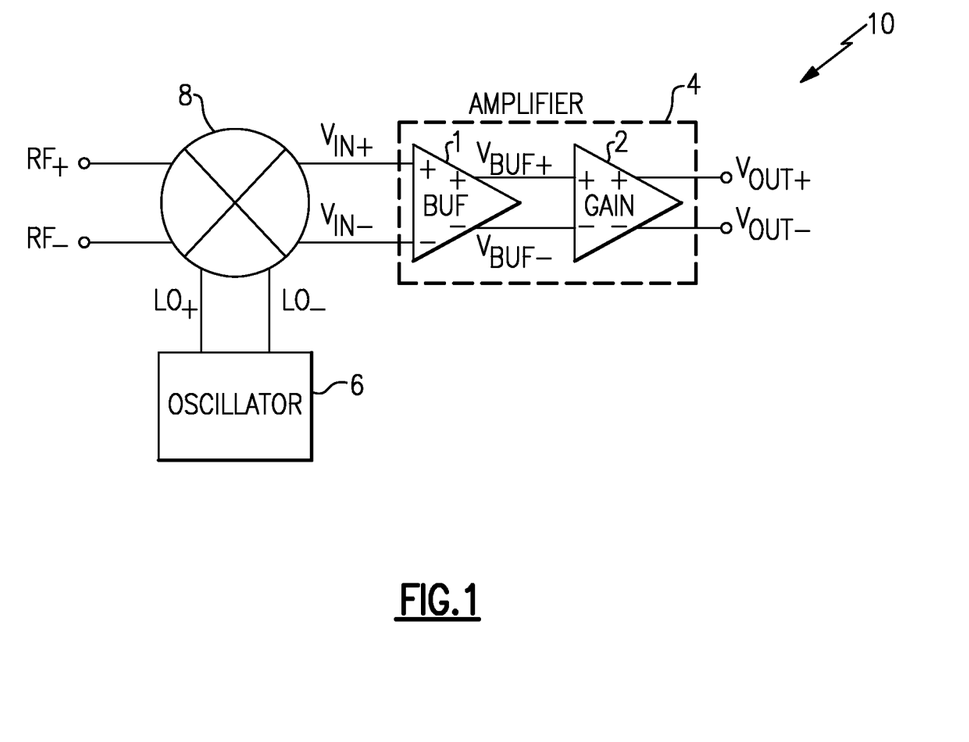
FIG. 1 is a schematic diagram of one example of an electronic system including an amplifier.

FIG. 1 is a schematic diagram of one example of an electronic system 10. The electronic system 10 includes an amplifier 4, a local oscillator 6, and a mixer 8.

The local oscillator 6 can be used to generate a differential clock signal $LO_+$, $LO_-$ having a particular frequency. For example, the local oscillator 6 can control the differential clock signal $LO_+$, $LO_-$ to have a frequency suitable for down-converting a radio frequency signal from a carrier frequency to an intermediate frequency.

The mixer 8 is configured to receive a differential radio frequency (RF) signal $RF_+$, $RF_-$ and the differential clock signal $LO_+$, $LO_-$ from the local oscillator 6. Additionally, the mixer 8 can multiply or mix the differential RF signal $RF_+$, $RF_-$ and the differential clock signal $LO_+$, $LO_-$ to generate a differential input signal $V_{IN+}$, $V_{IN-}$ for the amplifier 4. Configuring the mixer 8 in this manner can aid in downshifting a frequency content of the differential RF signal $RF_+$, $RF_-$ by about the frequency of the local oscillator 6.

The amplifier 4 is configured to amplify the differential input signal $V_{IN+}$, $V_{IN-}$ to generate a differential output signal $V_{OUT+}$, $V_{OUT-}$. The illustrated amplifier 4 includes a buffer stage or circuit 1 and a gain stage or circuit 2. The buffer circuit 1 includes a differential input configured to receive the differential input signal $V_{IN+}$, $V_{IN-}$ and a differential output configured to generate a differential buffered signal $V_{BUF+}$, $V_{BUF-}$. The gain circuit 2 includes a differential input configured to receive the differential buffered signal $V_{BUF+}$, $V_{BUF-}$ and a differential output configured to generate the differential output signal $V_{OUT+}$, $V_{OUT-}$.

Including the buffer circuit 1 in the amplifier 4 can increase the amplifier's bandwidth relative to a configuration in which the buffer circuit 1 is omitted. For example, the gain stage 2 can have a relatively low input impedance, which can impact the amplifier's bandwidth in configurations in which the mixer 8 directly provides the differential input signal $V_{IN+}$, $V_{IN-}$ to the gain stage 2. In contrast, the buffer circuit 1 can have relatively high input impedance and relatively low output impedance, and thus the buffer circuit 1 can increase the bandwidth of the amplifier 4 when it is connected between the mixer 8 and the gain stage 2.

The amplifier 4 can be used to boost the amplitude of the differential input signal $V_{IN+}$, $V_{IN-}$ generated by the mixer 8 to generate the differential output signal $V_{OUT+}$, $V_{OUT-}$. The amplifier 4 can provide the differential output signal $V_{OUT+}$, $V_{OUT-}$ to other components within the electronic system 10 and/or as outputs of the electronic system 10. In certain implementations, the amplifier 4 is a variable gain amplifier (VGA) having a controllable gain. For example, in certain implementations the gain of the amplifier 4 can be digitally controlled by an end-user. Although FIG. 1 illustrates a configuration in which the amplifier 4 includes two stages, the amplifier 4 can be adapted to include additional stages. For example, the amplifier 4 can be adapted to include additional gain stages and/or an output stage.

Although FIG. 1 illustrates one example of an electronic system in which the amplifier 4 can be used, the amplifier 4 can be used in other configurations and systems.

Overview of Examples of Amplifiers with High Linearity

Figure 2:
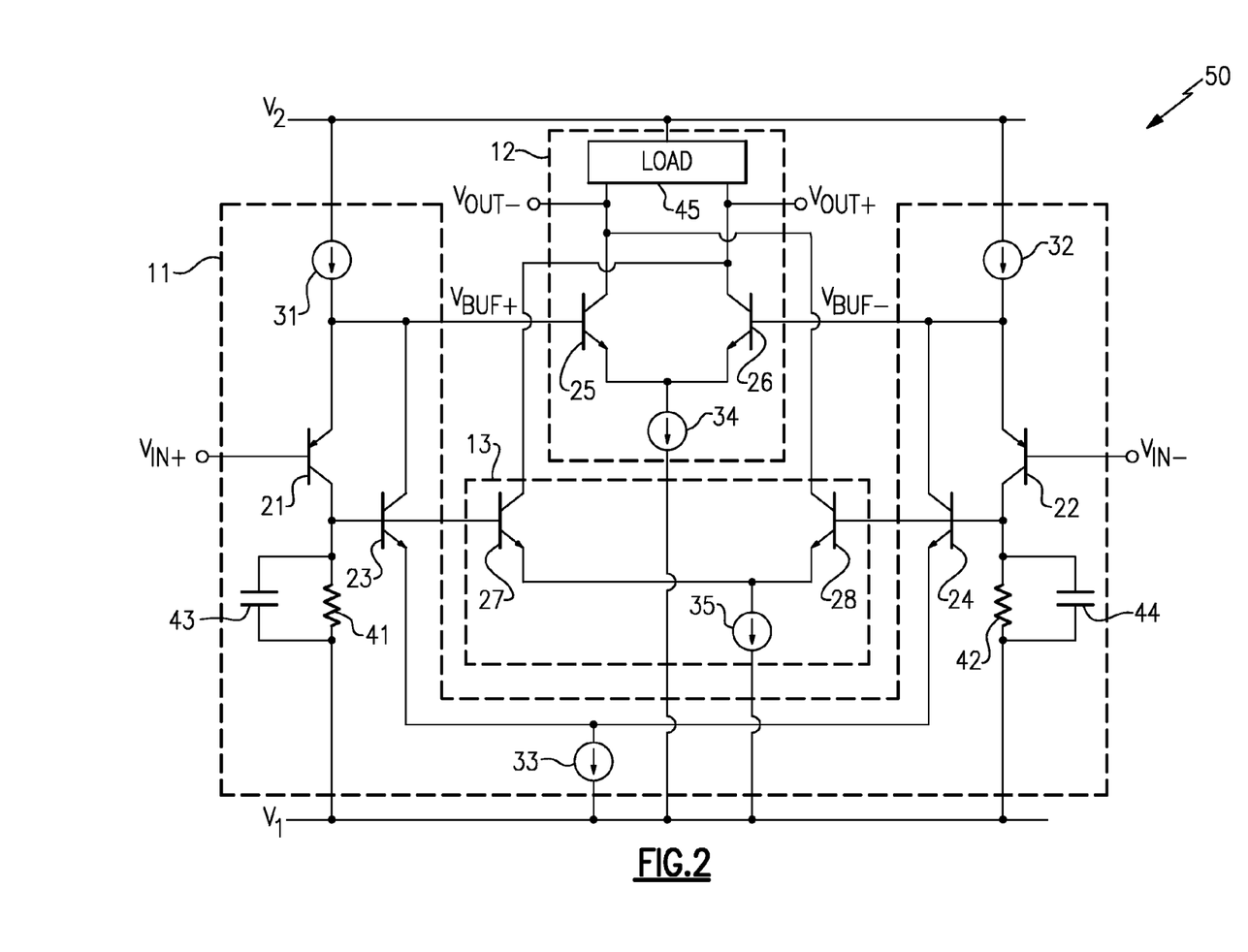
FIG. 2 is a schematic diagram of an amplifier in accordance with one embodiment.

FIG. 2 is a schematic diagram of an amplifier 50 in accordance with one embodiment. The amplifier 50 includes a buffer circuit 11, a gain circuit 12, and a current circulation circuit 13.

The buffer circuit 11 is configured to receive a differential input signal $V_{IN+}$, $V_{IN-}$ and to generate a differential buffered signal $V_{BUF+}$, $V_{BUF-}$. The gain circuit 12 is configured to receive the differential buffered signal $V_{BUF+}$, $V_{BUF-}$ and to generate a differential output signal $V_{OUT+}$, $V_{OUT-}$. The differential input signal $V_{IN+}$, $V_{IN-}$ can signal information as a difference between a first or non-inverted input signal $V_{IN+}$ and a second or inverted input signal $V_{IN-}$. Additionally, the differential buffered signal $V_{BUF+}$, $V_{BUF-}$ can signal information as a difference between a first or non-inverted buffered signal $V_{BUF+}$ and a second or inverted buffered signal $V_{BUF-}$. Furthermore, the differential output signal $V_{OUT+}$, $V_{OUT-}$ can signal information as a difference between a first or non-inverted output signal $V_{OUT+}$ and a second or inverted output signal $V_{OUT-}$.

The buffer circuit 11 includes a first PNP buffer transistor 21, a second PNP buffer transistor 22, a first NPN linearization transistor 23, a second NPN linearization transistor 24, a first current source 31, a second current source 32, a third current source 33, a first bias resistor 41, a second bias resistor 42, a first stabilization capacitor 43, and a second stabilization capacitor 44. The gain circuit 12 includes a first NPN gain transistor 25, a second NPN gain transistor 26, a fourth current source 34, and a load circuit 45. The current circulation circuit 13 includes a first NPN current circulation transistor 27, a second NPN current circulation transistor 28, and a fifth current source 35.

The first PNP buffer transistor 21 includes a base configured to receive the non-inverted input signal $V_{IN+}$, and an emitter electrically connected to a first terminal of the first current source 31, to a collector of the first NPN linearization transistor 23, and to a base of the first NPN gain transistor 25 at a node configured to generate the non-inverted buffered signal $V_{BUF+}$. The first PNP buffer transistor 21 further includes a collector electrically connected to a first end of the first bias resistor 41, to a first end of the first stabilization capacitor 43, to a base of the first NPN linearization transistor 23, and to a base of the first NPN current circulation transistor 27. The first bias resistor 41 further includes a second end electrically connected to a first power supply voltage $V_1$, which can be, for example, a ground or power low supply. The first stabilization capacitor 43 further includes a second end electrically connected to the first power supply voltage $V_1$. The first current source 31 further includes a second terminal electrically connected to a second power supply voltage $V_2$, which can be, for example, a power high supply. The first NPN linearization transistor 23 further includes an emitter electrically connected to an emitter of the second NPN linearization transistor 24 and to a first terminal of the third current source 33. The third current source 33 further includes a second terminal electrically connected to the first power supply voltage $V_1$.

The second PNP buffer transistor 22 includes a base configured to receive the inverted input signal $V_{IN-}$, and an emitter electrically connected to a first terminal of the second current source 32, to a collector of the second NPN linearization transistor 24, and to a base of the second NPN gain transistor 26 at a node configured to generate the inverted buffered signal $V_{BUF-}$. The second PNP buffer transistor 22 further includes a collector electrically connected to a first end of the second bias resistor 42, to a second end of the second stabilization capacitor 44, to a base of the second NPN linearization transistor 24, and to a base of the second NPN current circulation transistor 28. The second bias resistor 42 further includes a second end electrically connected to the first power supply voltage $V_1$. The second stabilization capacitor 44 further includes a second end electrically connected to the first power supply voltage $V_1$.

The first NPN gain transistor 25 further includes an emitter electrically connected to a first terminal of the fourth current source 34 and to an emitter of the second NPN gain transistor 26. The fourth current source 34 further includes a second terminal electrically connected to the first power supply voltage $V_1$. The first NPN gain transistor 25 further includes a collector electrically connected to a first terminal of the load circuit 45 and to a collector of the second NPN current circulation transistor 28 at a node configured to generate the inverted output signal $V_{OUT-}$. The second NPN gain transistor 26 further includes a collector electrically connected to a second terminal of the load circuit 45 and to a collector of the first NPN current circulation transistor 27 at a node configured to generate the non-inverted output signal $V_{OUT+}$. The first NPN current circulation transistor 27 further includes an emitter electrically connected to an emitter of the second NPN current circulation transistor 28 and to a first terminal of the fifth current source 35. The fifth current source 35 further includes a second terminal electrically connected to the first power supply voltage $V_1$.

When the amplifier 50 is amplifying the differential input signal $V_{IN+}$, $V_{IN-}$, the base-to-collector voltages of the first and second NPN gain transistors 25, 26 can change over time. The change in the base-to-collector voltages of the first and second NPN gain transistors 25, 26 can lead to a flow of displacement or $C*dV/dt$ currents through the base-to-collector or junction capacitances $C_{JC}$ of the first and second NPN gain transistors 25, 26.

The first and second NPN linearization transistors 23, 24 can be used to decrease the output impedance of the buffer circuit 11, thereby helping to reduce a fluctuation or change in the voltage of the differential buffered signal $V_{BUF+}$, $V_{BUF-}$ in response to the flow of $C_{JC}$ displacement currents from the first and second NPN gain transistors 25, 26. For example, the first bias resistor 41 and the first NPN linearization transistor 23 can operate to amplify current that flows through the first PNP buffer transistor 21. Similarly, the second bias resistor 42 and the second NPN linearization transistor 24 can operate to amplify current that flows through the second PNP buffer transistor 22. The amplification associated with the resistances of the first and second bias resistors 41, 42 and the transconductance of the first and second NPN linearization transistors 23, 24 can lead to a reduction in the output impedance of the buffer circuit 11 relative to a configuration in which the first and second NPN linearization transistors 23, 24 are omitted.

Additionally, the amplification can result in the collectors of the first and second NPN linearization transistors 23, 24 to sink or source a substantial portion of the displacement currents associated with the junction capacitance $C_{JC}$ of the first and second NPN gain transistors 25, 26.

Additionally, the current circulation circuit 13 can be used to circulate the displacement currents flowing through the base-to-collector or junction capacitances $C_{JC}$ of the first and second NPN gain transistors 25, 26. For example, the bases of the first and second NPN current circulation transistors 27, 28 are electrically connected to the bases of the first and second NPN linearization transistors 23, 24, respectively, and the collectors of the first and second NPN current circulation transistors 27, 28 are cross-coupled with respect to the collectors of the first and second NPN gain transistors 25, 26.

Thus, when a displacement current flows through a base-to-collector capacitance $C_{JC}$ of the first NPN gain transistor 25 and into the collector of the first NPN linearization transistor 23, the first NPN current circulation transistor 27 can mirror the $C_{JC}$ displacement current and provide the mirrored current to the collector of the second NPN gain transistor 26. As such, the current circulation circuit 13 can compensate for the flow of $C_{JC}$ displacement current from the collector of the first NPN gain transistor 25 by generating a corresponding current from the collector of the second NPN gain transistor 26. Since the amplifier 50 operates differentially, circulating the displacement current in this manner can reduce output distortion.

Similarly, when a displacement current flows through a base-to-collector capacitance $C_{JC}$ of the second NPN gain transistor 26 and into the collector of the second NPN linearization transistor 24, the second NPN current circulation transistor 28 can mirror the $C_{JC}$ displacement current and provide the mirrored current to the collector of the first NPN gain transistor 25. Thus, the current circulation circuit 13 can also compensate for the flow of displacement current from the collector of the second NPN gain transistor 26 by generating a corresponding current from the collector of the first NPN gain transistor 25.

The amplifier 50 of FIG. 1 illustrates a scheme in which a differential emitter-follower stage has been used to buffer the differential input signal $V_{IN+}$, $V_{IN-}$. Additionally, the current through the differential emitter-follower stage is sensed using the first and second bias resistors 41, 42, and amplified using the first and second NPN linearization transistors 23, 24. By configuring the amplifier in this manner, the output impedance of the amplifier's buffer circuit can be reduced, which can reduce a fluctuation in the voltage of the differential buffered signal $V_{BUF+}$, $V_{BUF-}$ in response to $C_{JC}$ displacement currents from the first and second NPN gain transistors 25, 26. Moreover, the illustrated configuration uses the first and second NPN current circulation transistors 27, 28 to circulate the $C_{JC}$ displacement currents back to the amplifier's outputs, thereby reducing distortion associated with the flow of the non-linear $C_{JC}$ displacement currents.

The first and second bias resistors 41, 42 can be used to control the loop gain of the feedback or control loops associated with the first and second NPN linearization transistors 23, 24. For example, a gain of the feedback loop used to amplify the current through the first PNP buffer transistor 21 can be based on a product of the resistance of the first bias resistor 41 and a transconductor of the first NPN linearization transistor 23. Similarly, a gain of the feedback loop used to amplify the current through the second PNP buffer transistor 22 can be based on a product of the resistance of the second bias resistor 42 and a transconductor of the second NPN linearization transistor 24.

In one embodiment, the first and second bias resistors 41, 42 each have a resistance selected to be in the range of about 600Ω to about 1 kΩ Although one example of resistances of the first and second bias resistors 41, 42 has been provided, the first and second bias resistors 41, 42 can be configured to have other resistance values, such as resistances that depend on application, process, and/or operating constraints.

The first and second stabilization capacitors 43, 44 can be used to maintain stability of the control loops associated with the first and second NPN linearization transistors 23, 24 and the first and second gain control resistors 41, 42. For example, the first and second stabilization capacitors 43, 44 can operate to limit a high frequency gain of the control loops. In one embodiment, the first and second stabilization capacitors 43, 44 each have a capacitance selected to be in the range of about 0.3 pF to about 0.5 pF. However, other capacitance values are possible, such as those associated with a particular amplifier configuration or application. For example, the capacitance values can depend on the operating frequency of the amplifier.

Although FIG. 2 illustrates one implementation of an amplifier in accordance with the buffer linearization schemes described herein, the teachings herein are applicable to other configurations of amplifiers. For example, the teachings herein are applicable to amplifiers including a different arrangement of components and/or more or fewer components. For example, in one embodiment, the current circulation circuit 13 is omitted. Furthermore, although FIG. 2 illustrates an amplifier in the context of PNP buffer transistors and NPN gain transistors, other configurations are possible. For example, the teachings herein are applicable to complementary circuit configurations and/or to configurations using other types of transistors.

Figure 3:
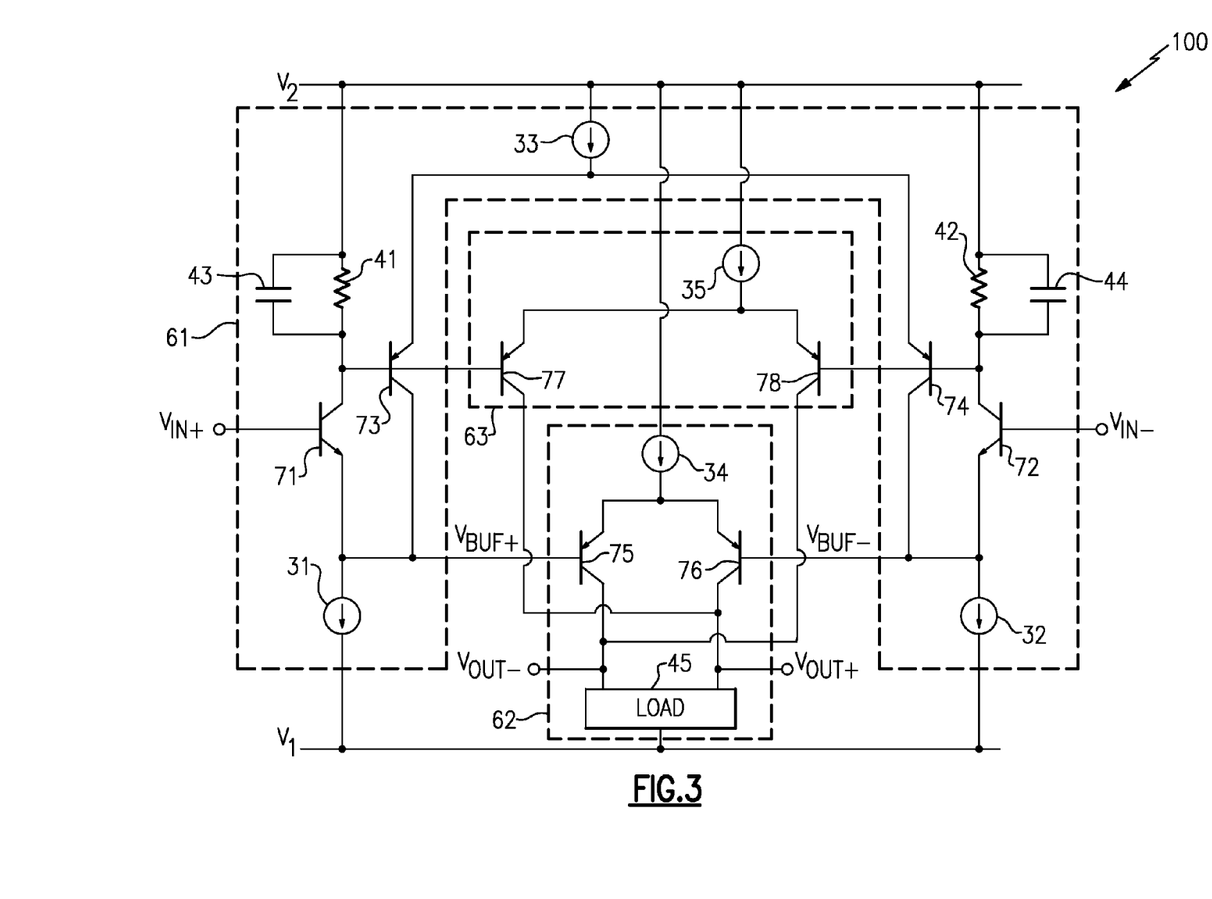
FIG. 3 is a schematic diagram of an amplifier in accordance with another embodiment.

FIG. 3 is a schematic diagram of an amplifier 100 in accordance with another embodiment.

The amplifier 100 includes a buffer circuit 61, a gain circuit 62, and a current circulation circuit 63. The buffer circuit 61 includes the first to third current sources 31-33, the first and second bias resistors 41, 42, and the first and second stabilization capacitors 43, 44, which can be as described earlier. Additionally, the buffer circuit 61 includes first and second NPN buffer transistors 71, 72 and the first and second PNP linearization transistors 73, 74. The gain circuit 62 includes the fourth current source 34 and the load circuit 45, which can be as described earlier. The gain circuit 62 further includes first and second PNP gain transistors 75, 76. The current circulation circuit 63 includes the fifth current source 33, which can be as described earlier. The current circulation circuit 63 further includes first and second PNP current circulation transistors 77, 78.

The amplifier 100 of FIG. 3 is similar to the amplifier 50 of FIG. 2, except that the amplifier 100 of FIG. 3 illustrates a complementary configuration which has been implemented using transistors of an opposite polarity type. For example, while the amplifier 50 of FIG. 2 includes the first and second PNP buffer transistors 21, 22, the amplifier 100 of FIG. 3 includes the first and second NPN buffer transistors 71, 72. Furthermore, while the amplifier 50 of FIG. 2 includes the first and second NPN linearization transistors 23, 24, the first and second NPN gain transistors 25, 26, and the first and second NPN current circulation transistors 27, 28, the amplifier 100 of FIG. 3 includes the first and second PNP linearization transistors 73, 74, the first and second PNP gain transistors 75, 76, and the first and second PNP current circulation transistors 77, 78. Additional details of the amplifier 100 can be similar to those described earlier.

Figure 4:
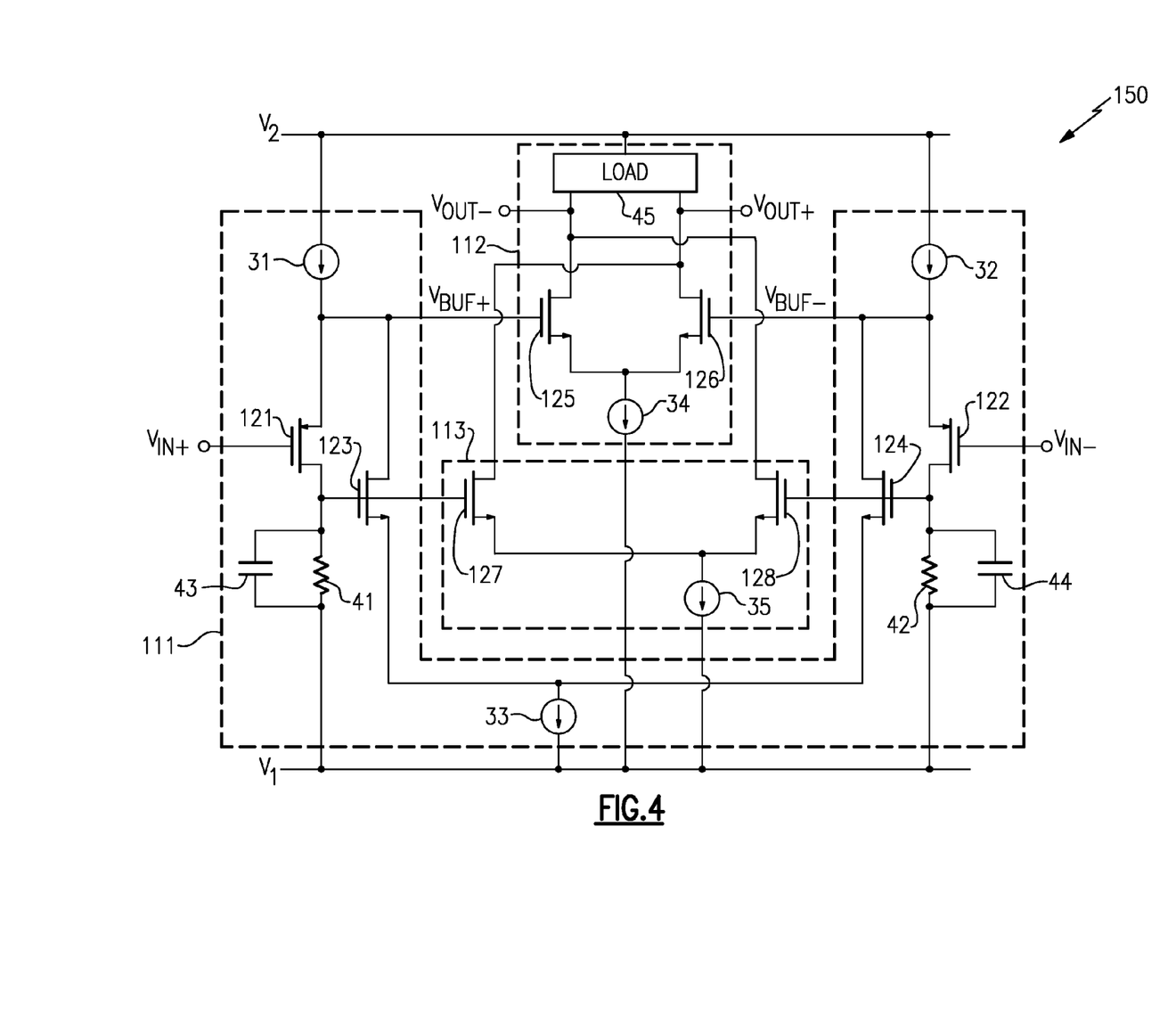
FIG. 4 is a schematic diagram of an amplifier in accordance with another embodiment.

FIG. 4 is a schematic diagram of an amplifier 150 in accordance with another embodiment.

The amplifier 150 includes a buffer circuit 111, a gain circuit 112, and a current circulation circuit 113. The buffer circuit 111 includes the first to third current sources 31-33, the first and second bias resistors 41, 42, and the first and second stabilization capacitors 43, 44, which can be as described earlier. Additionally, the buffer circuit 111 includes first and second p-type metal oxide semiconductor (PMOS) buffer transistors 121, 122 and the first and second n-type metal oxide semiconductor (NMOS) linearization transistors 123, 124. The gain circuit 112 includes the fourth current source 34 and the load circuit 45, which can be as described earlier. The gain circuit 112 further includes first and second NMOS gain transistors 125, 126. The current circulation circuit 113 includes the fifth current source 33, which can be as described earlier. The current circulation circuit 113 further includes first and second NMOS current circulation transistors 127, 128.

As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

The amplifier 150 of FIG. 4 is similar to the amplifier 50 of FIG. 2, except that the amplifier 150 of FIG. 4 illustrates a configuration which has been implemented using MOS transistors rather than bipolar transistors.

For example, the first PMOS buffer transistor 121 includes a gate configured to receive the non-inverted input signal $V_{IN+}$, and a source electrically connected to the first terminal of the first current source 31, to a drain of the first NMOS linearization transistor 123, and to a gate of the first NMOS gain transistor 125 at a node configured to generate the non-inverted buffered signal $V_{BUF+}$. The first PMOS buffer transistor 121 further includes a drain electrically connected to the first end of the first bias resistor 41, to the first end of the first stabilization capacitor 43, to a gate of the first NMOS linearization transistor 123, and to a gate of the first NMOS current circulation transistor 127. The first NMOS linearization transistor 123 further includes a source electrically connected to a source of the second NMOS linearization transistor 124 and to the first terminal of the third current source 33. The second PMOS buffer transistor 122 includes a gate configured to receive the inverted input signal $V_{IN-}$, and a source electrically connected to the first terminal of the second current source 32, to a drain of the second NMOS linearization transistor 124, and to a gate of the second NMOS gain transistor 126 at a node configured to generate the inverted buffered signal $V_{BUF-}$. The second PMOS buffer transistor 122 further includes a drain electrically connected to the first end of the second bias resistor 42, to the first end of the second stabilization capacitor 44, to a gate of the second NMOS linearization transistor 124, and to a gate of the second NMOS current circulation transistor 128. The first NMOS gain transistor 125 further includes a source electrically connected to the first terminal of the fourth current source 34 and to a source of the second NMOS gain transistor 126. The first NMOS gain transistor 125 further includes a drain electrically connected to the first terminal of the load circuit 45 and to a drain of the second NMOS current circulation transistor 128 at a node configured to generate the inverted output signal $V_{OUT-}$. The second NMOS gain transistor 126 further includes a drain electrically connected to the second terminal of the load circuit 45 and to a drain of the first NMOS current circulation transistor 127 at a node configured to generate the non-inverted output signal $V_{OUT+}$. The first NMOS current circulation transistor 127 further includes a source electrically connected to the source of the second NMOS current circulation transistor 128 and to the first terminal of the fifth current source 35. Additional details of the amplifier 150 can be similar to those described earlier.

Although FIG. 4 illustrates one implementation of a MOS amplifier in accordance with the teachings herein, other configurations are possible. For example, the teachings here are applicable to a complementary configuration implemented using MOS transistors having an opposite polarity type, with a corresponding reversal of current directions and voltage biasing. For example, in one embodiment, the first and second gain transistors are implemented as PMOS transistors, the first and second linearization transistors are implemented as PMOS transistors, and the first and second buffer transistors are implemented as NMOS transistors.

Figure 5:
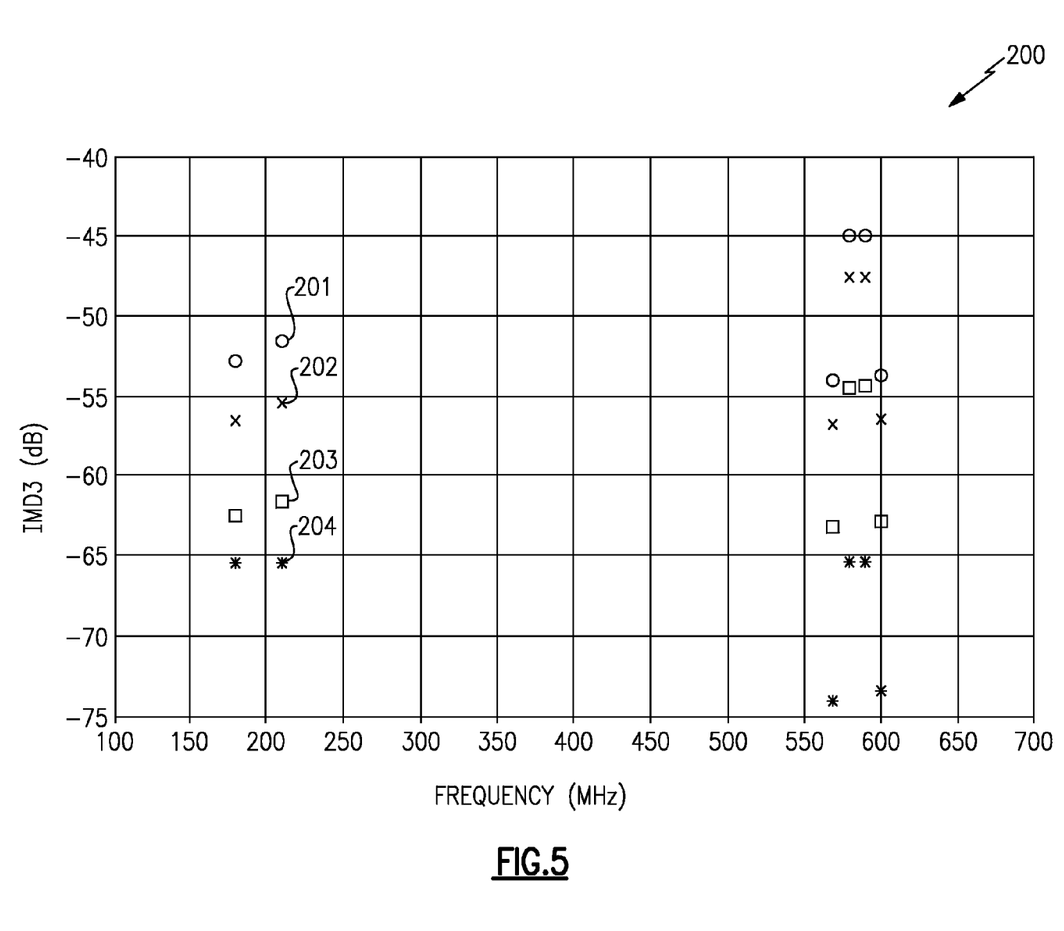
FIG. 5 is a graph of one example of third-order intermodulation distortion (IMD3) versus frequency.

FIG. 5 is a graph 200 of one example of third-order intermodulation distortion (IMD3) versus frequency.

The graph 200 includes first to fourth simulation results 201-204, which correspond to simulations of IMD3 versus frequency for four configurations of amplifiers. The simulations were simulated based on a two-tone intermodulation simulation using a 190 MHz tone signal and a 200 MHz tone signal. The results on the left-hand side of the graph 200 correspond to in-band IMD3, and the results on the right-hand side of the graph 200 correspond to out-of-band IMD3 and corresponding third-order harmonics (HD3s).

The first simulation results 201 (indicated by "o") correspond to an amplifier similar to that of the amplifier 50 of FIG. 2, except that the amplifier omits the buffer circuit 11 and the current circulation circuit 13. The second simulation results 202 (indicated by "x") correspond to an amplifier similar to that of the amplifier 50 of FIG. 2, except that the amplifier omits the first and second NPN linearization transistors 23, 24, the first and second bias resistors 41, 42, the first and second stabilization capacitors 43, 44, and the current circulation circuit 13. The third simulation results 203 (indicated by "□") correspond to an amplifier similar to that of the amplifier 50 of FIG. 2, except that the amplifier omits the current circulation circuit 13. The fourth simulation results 204 (indicated by "*") correspond to an amplifier similar to that of the amplifier 50 of FIG. 2.

The amplifier associated with the third simulation results 203 corresponds to an implementation in which the first and second bias resistors 41, 42 each have a resistance of 800Ω, and the first and second stabilization capacitors 43, 44 each have a capacitance of 0.3 pF. The amplifier associated with the fourth simulation results 204 corresponds to an implementation in which the first and second bias resistors 41, 42 each have a resistance of 800Ω, and the first and second stabilization capacitors 43, 44 each have a capacitance of 0.5 pF. Thus, the fourth simulation results 204 were simulated using higher capacitance values for the first and second stabilization capacitors 43, 44 relative to the third simulation results 203. When including the current circulation circuit 13, the capacitance of the first and second stabilization capacitors 43, 44 can be increased to maintain stability.

As shown in the simulation results of FIG. 5, including a linearization transistor pair in a buffer circuit can aid in improving an amplifier's IMD3 characteristics. The amplifier's IMD3 can be further improved by including a current circulation transistor pair.

Although FIG. 5 illustrates one example of simulation results in accordance with certain implementations described herein, other configurations are possible. For example, the results can change depending on components values, transistor models, and/or operating conditions.

Figure 6:
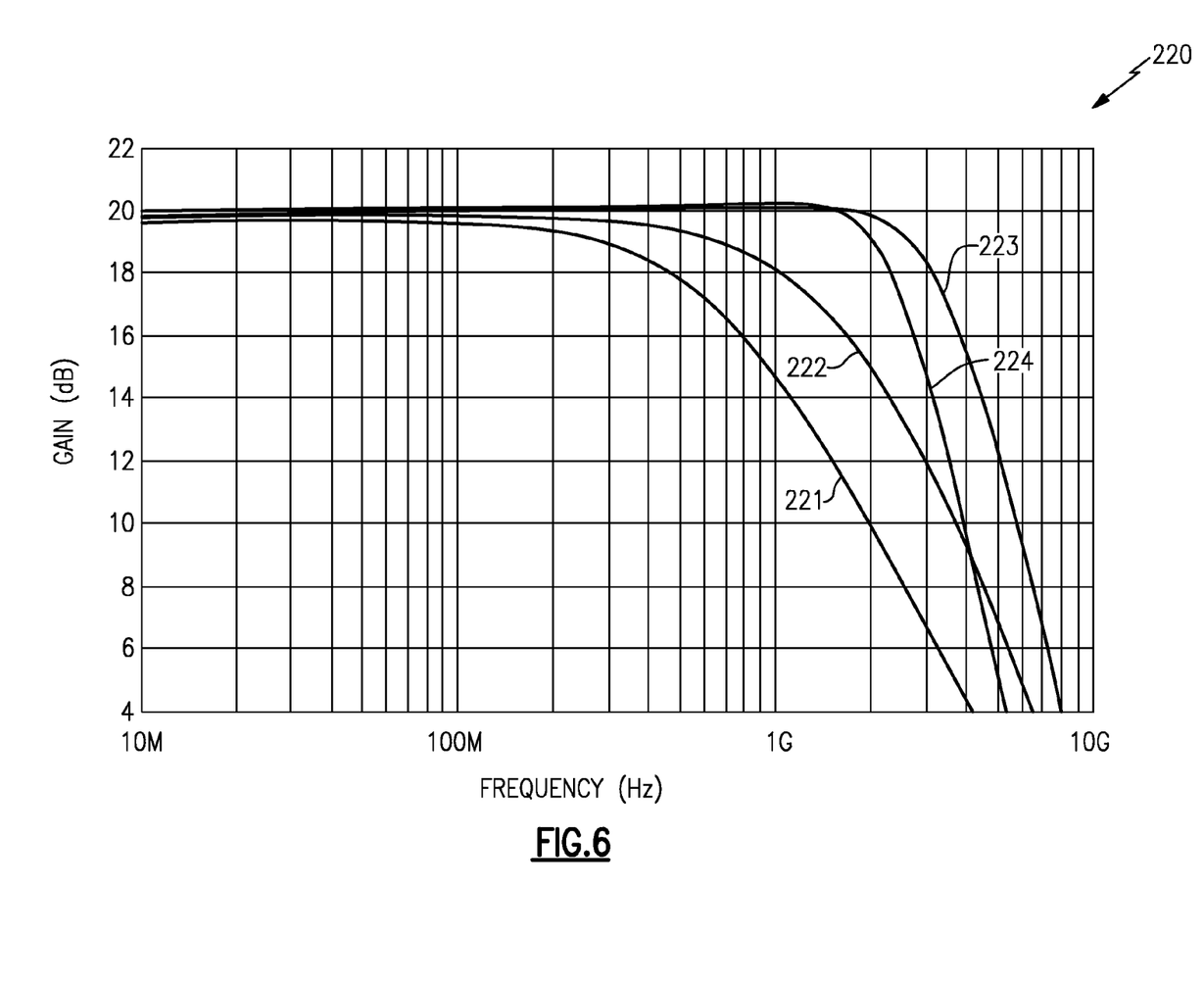
FIG. 6 is a graph of one example of gain versus frequency.

FIG. 6 is a graph 220 of one example of gain versus frequency.

The graph 220 includes first to fourth plots 221-224, which correspond to simulations of AC gain versus frequency for four configurations of amplifiers simulated at about 60° C. The first to fourth plots 221-224 correspond to gain versus frequency simulations for the amplifiers described earlier with respect to the first to fourth simulation results 201-204 of FIG. 5, respectively. As shown in FIG. 6, including a linearization transistor pair in a buffer circuit can enhance bandwidth.

Applications

The methods, systems, and/or apparatus described above can be implemented into various electronic devices.

Examples of the electronic devices can include, but are not limited to, consumer electronic products, parts of the consumer electronic products, electronic test equipment, etc. Examples of parts of consumer electronic products can include amplifiers, rectifiers, programmable filters, attenuators, variable frequency circuits, etc. Examples of the electronic devices can also include memory chips, memory modules, circuits of optical networks or other communication networks, and disk driver circuits. The consumer electronic products can include, but are not limited to, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected," as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

What is claimed is:

1. An apparatus comprising:
   a gain circuit comprising a first gain transistor and a second gain transistor, wherein a source of the first gain transistor is electrically connected to a source of the second gain transistor, and wherein the first and second gain transistors have a first type of device polarity; and
   a buffer circuit comprising:
      a first buffer transistor comprising a source electrically connected to a gate of the first gain transistor and a gate configured to receive a first input signal;
      a second buffer transistor comprising a source electrically connected to a gate of the second gain transistor and a gate configured to receive a second input signal, wherein the first and second buffer transistors have a second type of device polarity opposite the first type of device polarity;
      a first linearization transistor comprising a drain electrically connected to the gate of the first gain transistor and a gate electrically connected to a drain of the first buffer transistor; and
      a second linearization transistor comprising a drain electrically connected to the gate of the second gain transistor and a gate electrically connected to a drain of the second buffer transistor, wherein the first and second linearization transistors have the first type of device polarity.

2. The apparatus of claim 1, further comprising:
   a first bias resistor electrically connected between the drain of the first buffer transistor and a first power supply voltage; and
   a second bias resistor electrically connected between the drain of the second buffer transistor and the first power supply voltage.

3. The apparatus of claim 2, wherein the buffer circuit comprises a first control loop configured to amplify a current of the first buffer transistor, wherein a gain of the first control loop is based on a product of a resistance of the first bias resistor and a transconductance of the first linearization transistor, and wherein the buffer circuit further comprises a second control loop configured to amplify a current of the second buffer transistor, wherein a gain of the second control loop is based on a product of a resistance of the second bias resistor and a transconductance of the second linearization transistor.

4. The apparatus of claim 2, further comprising:
   a first stabilization capacitor electrically connected between the drain of the first buffer transistor and the first power supply voltage; and
   a second stabilization capacitor electrically connected between the drain of the second buffer transistor and the first power supply voltage.

5. The apparatus of claim 4, wherein a capacitance of the first and second stabilization capacitors is in a range of about 0.3 to about 0.5 pf.

6. The apparatus of claim 5, wherein a resistance of the first and second resistors is in a range of about 600Ω to about 1 kΩ.

7. The apparatus of claim 2, further comprising:
   a first current source electrically connected between a second power supply voltage and the source of the first buffer transistor;

a second current source electrically connected between the second power supply voltage and the source of the second buffer transistor;

a third current source including a first terminal electrically connected to the first power supply voltage and a second terminal electrically connected to a source of the first linearization transistor and to a source of the second linearization transistor;

a fourth current source including a first terminal electrically connected to the first power supply voltage and a second terminal electrically connected to the source of the first gain transistor and to the source of the second gain transistor.

8. The apparatus of claim 1, wherein the first and second gain transistors comprise n-type metal oxide semiconductor (NMOS) transistors, wherein the first and second linearization transistors comprise NMOS transistors, and wherein the first and second buffer transistors comprise p-type metal oxide semiconductor (PMOS) transistors.

9. The apparatus of claim 1, wherein the first and second gain transistors comprise PMOS transistors, wherein the first and second linearization transistors comprise PMOS transistors, and wherein the first and second buffer transistors comprise NMOS transistors.

10. The apparatus of claim 1, further comprising:
a load circuit electrically connected to a drain of the first gain transistor and to a drain of the second gain transistor, wherein the drain of the second gain transistor is configured to generate a first output signal, and wherein the drain of the second gain transistor is configured to generate a second output signal.

11. The apparatus of claim 1, further comprising a mixer, wherein the mixer is configured to modulate a differential local oscillator signal and a differential radio frequency signal to generate the first and second input signals.

12. The apparatus of claim 1, further comprising a current circulation circuit, wherein the current circulation circuit comprises:
a first current circulation transistor comprising a gate electrically connected to the gate of the first linearization transistor and a drain electrically connected to a drain of the second gain transistor; and
a second current circulation transistor comprising a gate electrically connected to the gate of the second linearization transistor and a drain electrically connected to a drain of the first gain transistor, wherein the first and second current circulation transistors have the first type of device polarity.

13. The apparatus of claim 12 further comprising:
a first bias resistor electrically connected between the drain of the first buffer transistor and a first power supply voltage;
a second bias resistor electrically connected between the drain of the second buffer transistor and the first power supply voltage;
a first current source electrically connected between a second power supply voltage and the source of the first buffer transistor;
a second current source electrically connected between the second power supply voltage and the source of the second buffer transistor;
a third current source including a first terminal electrically connected to the first power supply voltage and a second terminal electrically connected to a source of the first linearization transistor and to a source of the second linearization transistor;
a fourth current source including a first terminal electrically connected to the first power supply voltage and a second terminal electrically connected to the source of the first gain transistor and to the source of the second gain transistor; and
a fifth current source including a first terminal electrically connected to the first power supply voltage and a second terminal electrically connected to a source of the first current circulation transistor and to a source of the second current circulation transistor.

14. A method of electronic amplification comprising:
buffering a differential input signal to generate a differential buffered signal using a buffer circuit, wherein the buffer circuit comprises a first buffer transistor, a second buffer transistor, a first linearization transistor, and a second linearization transistor, wherein the differential input signal is received between a gate of the first buffer transistor and a gate of the second buffer transistor, wherein the differential buffered signal is generated between a source of the first buffer transistor and a source of the second buffer transistor, wherein the source of the first buffer transistor is electrically connected to a drain of the first linearization transistor, wherein the source of the second buffer transistor is electrically connected to a drain of the second linearization transistor, wherein the first and second linearization transistors have a first type of device polarity, and wherein the first and second buffer transistors have a second type of device polarity opposite the first type of device polarity; and
amplifying the differential buffered signal to generate an amplified differential signal using a gain circuit, wherein the gain circuit comprises a first gain transistor and a second gain transistor, wherein the differential buffered signal is received between a gate of the first gain transistor and a gate of the second gain transistor, wherein the amplified differential signal is generated between a drain of the first gain transistor and a drain of the second gain transistor, and wherein the first and second gain transistors have the first type of polarity.

15. The method of claim 14, further comprising:
circulating a first displacement current through a gate-to-drain capacitance of the first gain transistor to the drain of the second gain transistor using a first current circulation transistor, wherein the first current circulation transistor comprises a gate electrically connected to the gate of the first linearization transistor and a drain electrically connected to the drain of the second gain transistor, and wherein the first circulation transistor has the first type of device polarity; and
circulating a second displacement current through a gate-to-drain capacitance of the second gain transistor to the drain of the first gain transistor using a second current circulation transistor, wherein the second current circulation transistor comprises a gate electrically connected to the gate of the second linearization transistor and a drain electrically connected to the drain of the first gain transistor, wherein the second current circulation transistor has the first type of device polarity.

16. The method of claim 15, wherein the first and second gain transistors comprise n-type metal oxide semiconductor (NMOS) transistors, wherein the first and second linearization transistors comprise NMOS transistors, wherein the first and second buffer transistors comprise p-type metal oxide semiconductor (PMOS) transistors, and wherein the first and second current circulation transistors comprise NMOS transistors.

17. The method of claim 14, further comprising:
biasing the first buffer transistor using a first bias resistor; and
biasing the second buffer transistor using a second bias resistor.

18. The method of claim 17, further comprising amplifying a current of the first buffer transistor using a first control loop, and amplifying a current of the second buffer transistor using a second control loop, wherein a gain of the first control loop is based on a product of a resistance of the first bias resistor and a transconductance of the first linearization transistor, and wherein a gain of the second control loop is based on a product of a resistance of the second bias resistor and a transconductance of the second linearization transistor.

19. The method of claim 18, further comprising:
stabilizing the first control loop using a first stabilization capacitor; and
stabilizing the second control loop using a second stabilization capacitor.

20. The method of claim 14, further comprising modulating a differential local oscillator signal and a differential radio frequency signal to generate the differential input signal.

\* \* \* \* \*